(12) United States Patent
Inate

(10) Patent No.: US 11,742,830 B2
(45) Date of Patent: Aug. 29, 2023

(54) ELASTIC WAVE DEVICE

(71) Applicant: Murata Manufacturing Co., Ltd., Nagaokakyo (JP)

(72) Inventor: Kenji Inate, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 1514 days.

(21) Appl. No.: 15/973,562

(22) Filed: May 8, 2018

(65) Prior Publication Data
US 2018/0254765 A1    Sep. 6, 2018

Related U.S. Application Data

(63) Continuation of application No. PCT/JP2016/084451, filed on Nov. 21, 2016.

(30) Foreign Application Priority Data

Dec. 24, 2015 (JP) .................. 2015-251477

(51) Int. Cl.
H03H 9/64      (2006.01)
H03H 9/145     (2006.01)
(Continued)

(52) U.S. Cl.
CPC ...... *H03H 9/6496* (2013.01); *H03H 9/02559* (2013.01); *H03H 9/02645* (2013.01);
(Continued)

(58) Field of Classification Search
CPC ............ H03H 9/02; H03H 9/145; H03H 9/25; H03H 9/64
See application file for complete search history.

(56) References Cited

U.S. PATENT DOCUMENTS 7,078,989 B2 * 7/2006 Inoue ..................... H03H 9/643
                                                     333/195
7,180,388 B2 * 2/2007 Matsuda ................ H03H 9/725
                                                     333/194
(Continued)

FOREIGN PATENT DOCUMENTS

JP    09-232908 A      9/1997
JP    09232908 A  *    9/1997
(Continued)

OTHER PUBLICATIONS

Official Communication issued in International Patent Application No. PCT/JP2016/084451, dated Feb. 7, 2017.
(Continued)

*Primary Examiner* — Hafizur Rahman
*Assistant Examiner* — Alan Wong
(74) *Attorney, Agent, or Firm* — Keating & Bennett, LLP

(57) ABSTRACT

An elastic wave device includes a piezoelectric substrate, a first elastic wave element on the piezoelectric substrate and including at least one first interdigital transducer electrode and a first reflector in an area of the first interdigital transducer electrode at one side in a propagation direction of elastic waves, and a second elastic wave element on the piezoelectric substrate and including at least one second interdigital transducer electrode and a second reflector in an area of the second interdigital transducer electrode at one side in the propagation direction of elastic waves. The first and second reflectors are disposed side by side in the propagation direction. A reflection member, between the first and second reflectors, reflects elastic waves in at least a direction different from the propagation direction.

20 Claims, 4 Drawing Sheets

(51) Int. Cl.
*H03H 9/25* (2006.01)
*H03H 9/72* (2006.01)
*H03H 9/02* (2006.01)
*H10N 30/87* (2023.01)

(52) U.S. Cl.
CPC .... *H03H 9/02685* (2013.01); *H03H 9/02795* (2013.01); *H03H 9/02818* (2013.01); *H03H 9/14552* (2013.01); *H03H 9/25* (2013.01); *H03H 9/6483* (2013.01); *H03H 9/725* (2013.01); *H10N 30/877* (2023.02)

(56) References Cited

U.S. PATENT DOCUMENTS

| | | | | |
|---|---|---|---|---|
| 7,202,590 B2* | 4/2007 | Matsuda | ............ | H03H 9/02905 333/195 |
| 7,400,216 B2* | 7/2008 | Fuse | .................... | H03H 9/0576 333/133 |
| 7,453,335 B2* | 11/2008 | Funami | .................. | H03H 9/725 333/195 |
| 8,354,895 B2* | 1/2013 | Kawamoto | ........ | H03H 9/02637 333/195 |
| 9,518,863 B2* | 12/2016 | Tsuzuki | ................ | B06B 1/0622 |

FOREIGN PATENT DOCUMENTS

| | | |
|---|---|---|
| JP | 2000-106519 A | 4/2000 |
| JP | 2006-186433 A | 7/2006 |
| JP | 2008-160669 A | 7/2008 |
| JP | 2013-085210 A | 5/2013 |

OTHER PUBLICATIONS

Official Communication issued in Korean Patent Application No. 10-2018-7017530, dated May 29, 2019.

* cited by examiner

ELASTIC WAVE DEVICE

CROSS REFERENCE TO RELATED APPLICATIONS

This application claims the benefit of priority to Japanese Patent Application No. 2015-251477 filed on Dec. 24, 2015 and is a Continuation Application of PCT Application No. PCT/JP2016/084451 filed on Nov. 21, 2016. The entire contents of each application are hereby incorporated herein by reference.

BACKGROUND OF THE INVENTION

1. Field of the Invention

The present invention relates to an elastic wave device, such as a resonator or a band-pass filter.

2. Description of the Related Art

Elastic wave devices have been widely used as resonators or band-pass filters.

Japanese Unexamined Patent Application Publication No. 2006-186433 discloses an elastic wave device used as an elastic surface acoustic wave filter including multiple longitudinally coupled elastic surface acoustic wave filters. The multiple longitudinally coupled elastic surface acoustic wave filters are arranged side by side in a propagation direction of surface acoustic waves and each include multiple interdigital transducer electrodes and grating reflectors on both sides of the interdigital transducer electrodes in the propagation direction of the surface acoustic waves. Each grating reflector is used in common between adjacent longitudinally coupled elastic surface acoustic wave filters.

When, as in the case of the elastic wave device disclosed in Japanese Unexamined Patent Application Publication No. 2006-186433, a reflector is used in common between two adjacent elastic wave elements and the reflector includes fewer electrode fingers, the elastic wave device is likely to cause ripples in a pass band. Even when two elastic wave elements are located adjacent to each other without using a reflector in common, if the distance between adjacent reflectors is short, the elastic wave device is likely to cause ripples in a pass band. In either case, such an occurrence of ripples hinders size reduction of elastic wave devices.

SUMMARY OF THE INVENTION

Preferred embodiments of the present invention provide elastic wave devices that each have a small size while maintaining characteristics.

An elastic wave device according to a preferred embodiment of the present invention includes a piezoelectric substrate, a first elastic wave element disposed on the piezoelectric substrate and including at least one first interdigital transducer electrode and a first reflector disposed over an area of the first interdigital transducer electrode at one side portion in a propagation direction of elastic waves, and a second elastic wave element disposed on the piezoelectric substrate and including at least one second interdigital transducer electrode and a second reflector disposed over an area of the second interdigital transducer electrode at one side portion in the propagation direction of elastic waves. The first reflector and the second reflector are arranged side by side in the propagation direction of elastic waves. The elastic wave device further includes a reflection member between the first and second reflectors, the reflection member reflecting elastic waves in at least a direction different from the propagation direction of elastic waves.

In an elastic wave device according to a preferred embodiment of the present invention, a plurality of the reflection members are arranged with no gap therebetween in the propagation direction of elastic waves. In this case, the elastic wave device is able to more efficiently maintain its characteristics.

In an elastic wave device according to a preferred embodiment of the present invention, the plurality of reflection members are arranged in a single row in a direction crossing the propagation direction of elastic waves. Preferably, the direction crossing the propagation direction of elastic waves is a direction perpendicular or substantially perpendicular to the propagation direction of elastic waves. In this case, the elastic wave device is able to have a smaller size.

In an elastic wave device according to a preferred embodiment of the present invention, the reflection member has a curved contour when viewed in plan view. The reflection member may have a circular or substantially circular shape or an oval or substantially oval shape when viewed in plan view. In this case, the elastic wave device is able to scatter the excited elastic waves in various directions different from the propagation direction of elastic waves. Thus, the elastic wave device is able to more efficiently maintain its characteristics.

In an elastic wave device according to a preferred embodiment of the present invention, the reflection member has a rectangular or substantially rectangular shape when viewed in plan view. In this case, the elastic wave device is able to more reliably reflect the excited elastic waves in a direction different from the propagation direction of elastic waves. Thus, the elastic wave device is able to more efficiently maintain its characteristics.

In an elastic wave device according to a preferred embodiment of the present invention, a direction in which a major axis of the oval or substantially oval reflection member or a long side of the rectangular or substantially rectangular reflection member extends is inclined about 45 degrees plus or minus about 25 degrees from the propagation direction of elastic waves when viewed in plan view. In this case, the elastic wave device is able to more reliably reflect the excited elastic waves in a direction different from the propagation direction of elastic waves. Thus, the elastic wave device is able to more efficiently maintain its characteristics.

Preferred embodiments of the present invention provide elastic wave devices that have a small size and maintain their characteristics.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Specific preferred embodiments of the present invention are described below with reference to the drawings in order to clarify the present invention.

Each of the preferred embodiments described herein is illustrated as a mere example. Throughout the preferred embodiments, components may be partially replaced or combined as appropriate.

Figure 1:
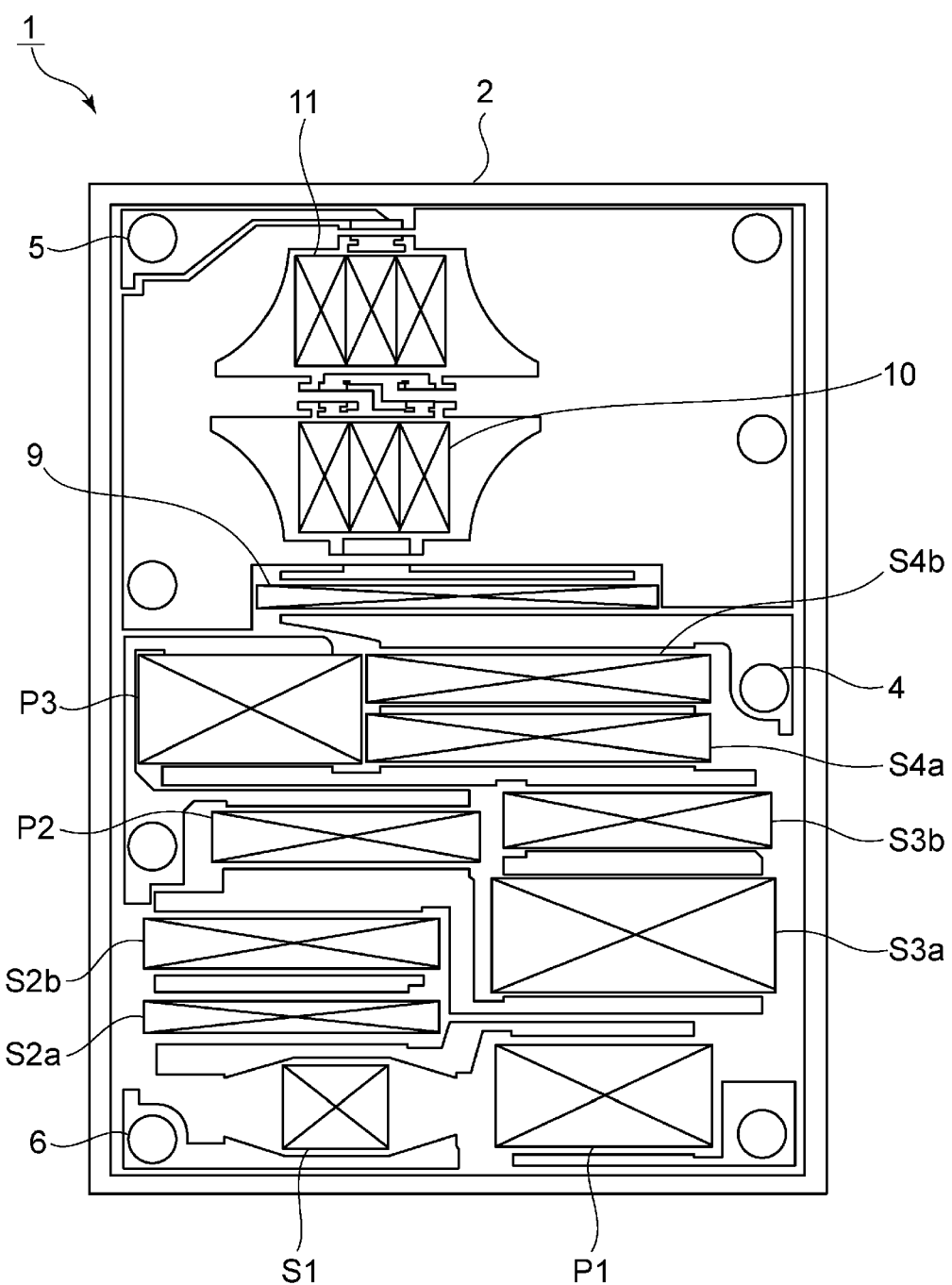
FIG. 1 is a schematic plan view of an elastic wave device according to a preferred embodiment of the present invention.
Figure 2A:
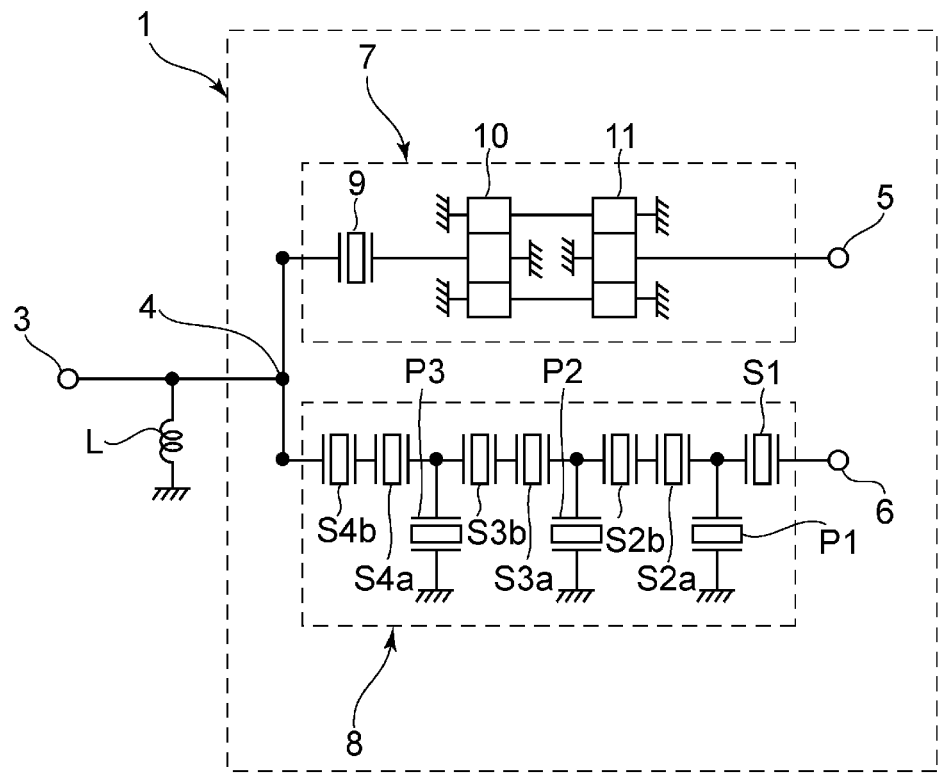
FIG. 2A is a circuit diagram of an elastic wave device according to a preferred embodiment of the present invention and FIG. 2B is a schematic plan view of an electrode structure of a single-port elastic wave resonator.

FIG. 1 is a schematic plan view of an elastic wave device according to a preferred embodiment of the present invention. FIG. 2A is a circuit diagram of an elastic wave device according to a preferred embodiment of the present invention.

As illustrated in FIG. 1, an elastic wave device 1 includes a piezoelectric substrate 2. The piezoelectric substrate 2 is preferably made of a piezoelectric single crystal, such as $LiTaO_3$ or $LiNbO_3$ or a piezoelectric ceramic substrate, for example. In the present preferred embodiment, the piezoelectric substrate 2 is preferably a piezoelectric single crystal substrate having a rectangular or substantially rectangular plate shape, for example.

In the present preferred embodiment, a plurality of elastic wave elements are disposed on the piezoelectric substrate 2 and define and function as a duplexer. Preferably, the duplexer in the present preferred embodiment is, for example, a band 8 (Tx band of about 880 MHz to about 915 MHz and Rx band of about 925 MHz to about 960 MHz) duplexer including a ladder filter defining and functioning as a transmitting filter (Tx) and a longitudinally coupled filter defining and functioning as a receiving filter (Rx). Specifically, the duplexer has a circuit configuration illustrated in FIG. 2A.

As illustrated in FIG. 2A, the elastic wave device 1 includes a common terminal 4 connected to an antenna terminal 3. An impedance matching inductor L is connected between the antenna terminal 3 and the ground potential. A receiving filter 7 is disposed between the common terminal 4 and a reception terminal 5. A transmitting filter 8 is disposed between the common terminal 4 and a transmission terminal 6.

The receiving filter 7 includes a single-port elastic wave resonator 9 defining and functioning as a trap filter and connected to the common terminal 4. The receiving filter 7 also preferably includes 3-IDT longitudinally coupled resonator elastic wave filter portions 10 and 11, for example, between the single-port elastic wave resonator 9 and the reception terminal 5. The longitudinally coupled resonator elastic wave filter portions 10 and 11 are connected together in a cascading manner. Each of the longitudinally coupled resonator elastic wave filter portions 10 and 11 includes a plurality of interdigital transducer electrodes, arranged side by side in a propagation direction of surface acoustic waves that propagate over the surface of the piezoelectric substrate 2, and reflectors on both sides of the group of the plurality of interdigital transducer electrodes. A longitudinally coupled resonator elastic wave filter portion may preferably include, for example, five interdigital transducer electrodes, as an example of a group of three or more odd-numbered interdigital transducer electrodes.

FIG. 1 is referred to again to schematically illustrate, in a framed X shape, portions of the piezoelectric substrate 2 on which the single-port elastic wave resonator 9 and the longitudinally coupled resonator elastic wave filter portions 10 and 11 are disposed. In the receiving filter 7, the portions on which the single-port elastic wave resonator 9 and the longitudinally coupled resonator elastic wave filter portions 10 and 11 are disposed are elastic wave elements.

As illustrated in FIG. 2A, the transmitting filter 8 preferably has a ladder circuit structure, for example. Specifically, the transmitting filter 8 includes serial arm resonators S1, S2a, S2b, S3a, S3b, S4a, and S4b and parallel arm resonators P1 to P3, each of which is an elastic wave resonator. The serial arm resonators S1 to S4b and the parallel arm resonators P1 to P3 are preferably single-port elastic wave resonators, for example.

Figure 2B:
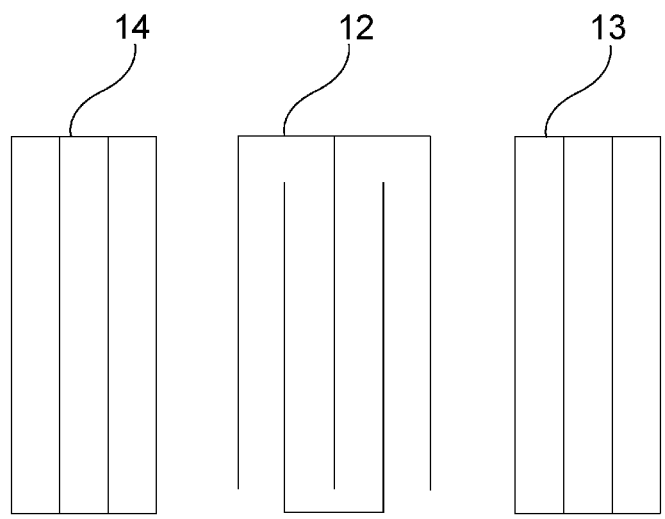

Each single-port elastic wave resonator has an electrode structure as illustrated in FIG. 2B. An interdigital transducer electrode 12 and reflectors 13 and 14 disposed on both sides of the interdigital transducer electrode 12 in the propagation direction of elastic waves are disposed on the piezoelectric substrate 2. The single-port elastic wave resonator has such a structure.

FIG. 1 is referred to again to schematically illustrate, with symbols of an X in a rectangular frame, portions of the piezoelectric substrate 2 on which the serial arm resonators S1 to S4b and the parallel arm resonators P1 to P3 are disposed. Specifically, the portions on which the serial arm resonators S1 to S4b and the parallel arm resonators P1 to P3 are disposed are elastic wave elements. In the present preferred embodiment, the parallel arm resonator P3 is a first elastic wave element and the serial arm resonator S4b is a second elastic wave element.

The interdigital transducer electrodes, the reflectors, and connection wires in each elastic wave element may preferably be made of an appropriate metal, such as Al, Ti, Ag, Cu, Pt, or W or an alloy thereof, for example.

Figure 3:
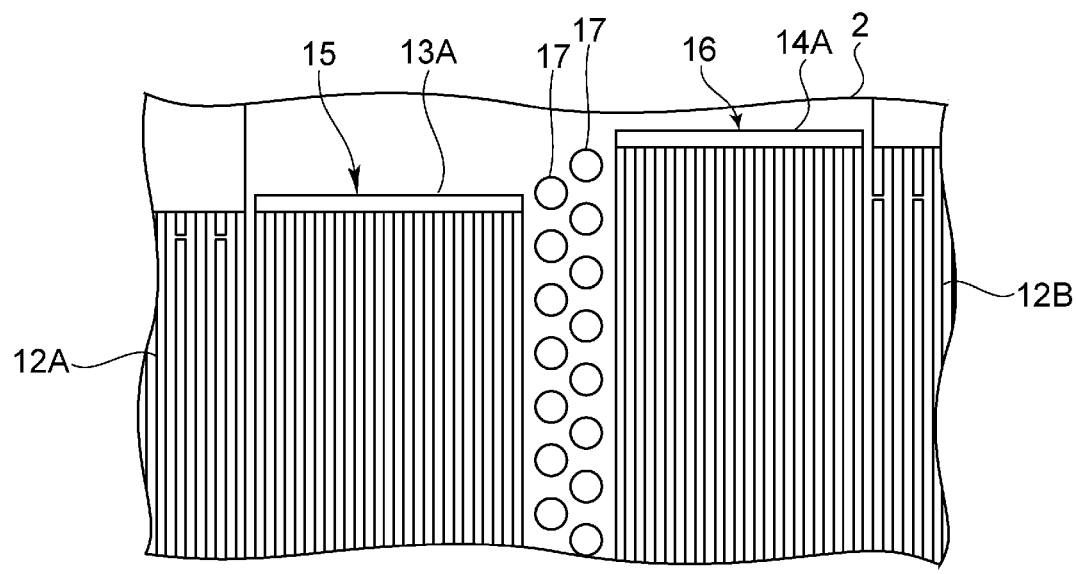
FIG. 3 is an enlarged schematic plan view of a portion illustrated in FIG. 1 in which first and second elastic wave elements are disposed.

FIG. 3 is an enlarged schematic plan view of a portion of FIG. 1 in which first and second elastic wave elements are disposed.

As illustrated in FIG. 3, a first elastic wave element 15 includes a first interdigital transducer electrode 12A and a first reflector 13A. The first reflector 13A is disposed over an area of the first interdigital transducer electrode 12A at one side portion in a propagation direction of elastic waves excited by the first interdigital transducer electrode 12A. Although not illustrated, another reflector preferably is also disposed over the area of the first interdigital transducer electrode 12A at one side portion opposite in the propagation direction of elastic waves.

A second elastic wave element 16 is provided next to the first elastic wave element 15 in the propagation direction of elastic waves. The second elastic wave element 16 includes a second interdigital transducer electrode 12B and a second reflector 14A. The second reflector 14A is disposed over an area of the second interdigital transducer electrode 12B at a one side portion in the propagation direction of elastic waves excited by the second interdigital transducer electrode 12B. The second reflector 14A is provided next to the first reflector 13A in the propagation direction of elastic waves. Although not illustrated, another reflector is also disposed over the area of the second interdigital transducer electrode 12B at a side portion in the propagation direction of elastic waves.

In the present preferred embodiment, reflection members 17 are disposed between the first reflector 13A and the second reflector 14A. Each reflection member 17 reflects elastic waves in a direction different from at least the propagation direction of elastic waves. When viewed in plan view, each reflection member 17 preferably has a circular or substantially circular shape, for example. In the present preferred embodiment, the plurality of reflection members 17 preferably having the same or substantially the same shape and size are disposed in two rows in a direction perpendicular or substantially perpendicular to the propagation direction of elastic waves. Specifically, reflection members 17 in a row adjacent to the first reflector 13A and reflection members 17 in a row adjacent to the second reflector 14A are alternately arranged in a direction perpendicular or substantially perpendicular to the propagation direction of elastic waves.

In an area in which the plurality of reflection members 17 are superposed on a crossing area of one elastic wave element in the propagation direction of elastic waves, the plurality of reflection members 17 are arranged with no gap therebetween. In addition, in an area in which the multiple reflection members 17 overlap with a crossing area of another elastic wave element in the propagation direction of elastic waves, the multiple reflection members 17 are arranged with no gap therebetween.

Specifically, in the present preferred embodiment, when viewed in the propagation direction of elastic waves, the reflection members 17 in the row adjacent to the first reflector 13A and the reflection members 17 in the row adjacent to the second reflector 14A are arranged so as to be in contact with each other. When viewed in the propagation direction of elastic waves, the reflection members 17 in the row adjacent to the first reflector 13A and the reflection members 17 in the row adjacent to the second reflector 14A may overlap or not overlap with one another. From the view point of more efficiently preventing leaked elastic waves from arriving at the elastic wave elements, preferably, the reflection members 17 in the row adjacent to the first reflector 13A and the reflection members 17 in the row adjacent to the second reflector 14A are in contact with one another or overlap at least partially when viewed in the propagation direction of elastic waves.

Thus, in the elastic wave device 1, the reflection members 17 that reflect elastic waves in at least a direction different from the propagation direction of elastic waves are disposed between the first reflector 13A and the second reflector 14A. The elastic wave device 1 is thus capable of maintaining its characteristics while having a small size. This effect is described in detail, below.

In an existing device including two elastic wave elements arranged adjacent to each other in the propagation direction of elastic waves, mechanical vibration of one of the elastic wave elements may leak to the other elastic wave element and cause ripples in the pass band of the other elastic wave element. In addition, mechanical vibration of one of the elastic wave elements may be reflected by a reflector of the other elastic wave element and the reflected mechanical vibration may cause ripples inside the pass band of the one elastic wave element. To prevent such characteristic deterioration of the elastic wave elements, the distance between the two elastic wave elements is extended. Thus, when an existing elastic wave device includes two elastic wave elements arranged adjacent to each other, size reduction of the elastic wave device while maintaining the characteristics of the elastic wave elements has been difficult.

On the other hand, as described above, the elastic wave device 1 according to the present preferred embodiment includes the reflection members 17 between the first and second elastic wave elements 15 and 16, which are adjacent to each other. The reflection members 17 are capable of reflecting elastic waves excited by the first and second interdigital transducer electrodes 12A and 12B in at least a direction different from the propagation direction of elastic waves. Specifically, the elastic wave device 1 allows fewer components of mechanical vibration of one of the elastic wave elements to arrive at the other elastic wave element, so that the characteristics of the other elastic wave element are less likely to deteriorate. In addition, the mechanical vibration of one of the elastic wave elements is reflected by the reflection members 17 before arriving at the reflector on the other side. Thus, the components of the reflected mechanical vibration returning to the one elastic wave element are reduced and the characteristics of the one elastic wave element are less likely to deteriorate. The characteristics of the elastic wave device 1 are, thus, less likely to deteriorate even when the distance between the first and second elastic wave elements 15 and 16 is small. Thus, the elastic wave device 1 is capable of having a small size while maintaining its characteristics.

As described above, in the elastic wave device 1, the multiple reflection members 17 are arranged without a gap therebetween in the propagation direction of elastic waves. Specifically, the plurality of reflection members 17 are arranged so as to block a path of leaked elastic waves leading to the elastic wave elements in the propagation direction of elastic waves. Thus, the characteristics of the elastic wave device 1 are more efficiently maintained.

In the present preferred embodiment, each reflection member 17 preferably has a circular or substantially circular shape, for example, when viewed in plan view. Thus, propagating elastic waves are scattered in various different directions. In preferred embodiments of the present invention, the reflection member 17 may have various other shapes, as described in modifications below.

Each reflection member 17 may preferably be made of an appropriate metal such as Al, Ti, Ag, Cu, Pt, or W or an alloy, for example. Each reflection member 17 may be formed by a lift-off or etching method concurrently with the first and second interdigital transducer electrodes 12A and 12B. The reflection member 17 may be manufactured in a method different from that by which the first and second interdigital transducer electrodes 12A and 12B are formed.

Figure 4:
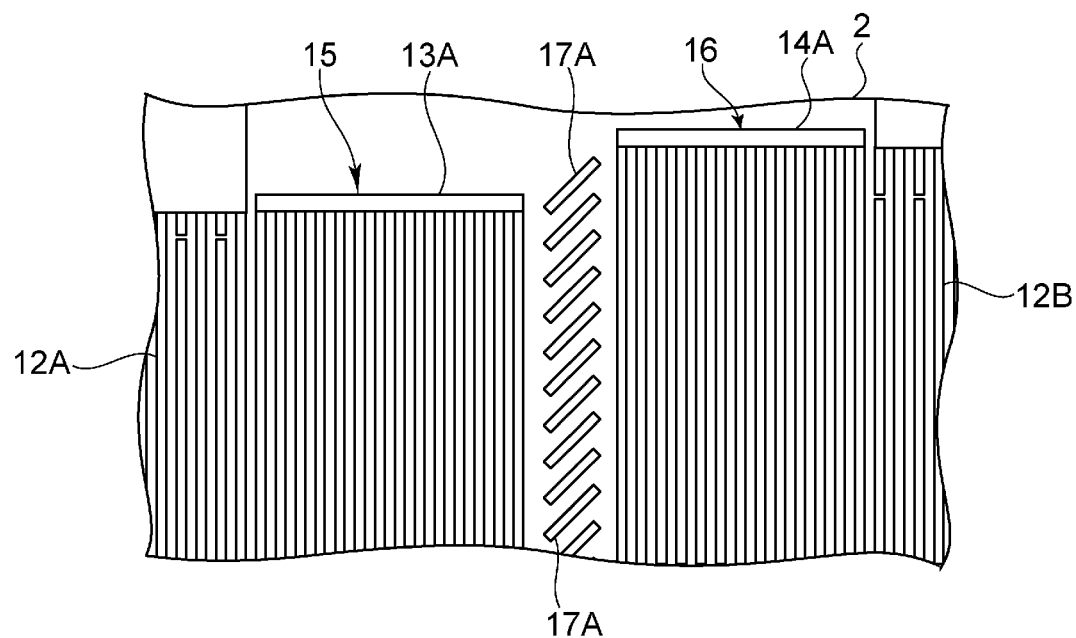
FIG. 4 is an enlarged schematic plan view of a portion of an elastic wave device according to a first modification of a preferred embodiment of the present invention, in which first and second elastic wave elements are disposed.

FIG. 4 is an enlarged schematic plan view of a portion of a first modification of an elastic wave device according to a preferred embodiment of the present invention, in which the first and second elastic wave elements are disposed.

As illustrated in FIG. 4, in the elastic wave device according to the first modification, reflection members 17A are disposed between the first and second reflectors 13A and 14A. More specifically, a plurality of reflection members 17A are arranged in a single row in a direction perpendicular or substantially perpendicular to the propagation direction of elastic waves between the first and second reflectors 13A and 14A. Each reflection member 17A preferably has a rectangular or substantially rectangular shape, for example, when viewed in plan view. When viewed in plan view, the direction in which the long side of each reflection member 17A extends is preferably inclined approximately 45 degrees, for example, from the propagation direction of elastic waves. Other aspects are the same or substantially the same as those in the elastic wave device 1.

In the elastic wave device according to the first modification, the plurality of reflection members 17A reflect elastic waves excited by the interdigital transducer electrode in at least a direction different from the propagation direction of elastic waves. Thus, the elastic wave device according to the first modification is able to have a small size while maintaining its characteristics.

Particularly, in the elastic wave device according to the present modification, a plurality of reflection members 17A are disposed in a single row in a direction perpendicular or substantially perpendicular to the propagation direction of elastic waves between the first and second reflectors 13A and 14A. Thus, the elastic wave device is able to have smaller size. Therefore, in the elastic wave device according to a preferred embodiment of the present invention, preferably, a plurality of reflection members are arranged in a single row in a direction perpendicular or substantially perpendicular to the propagation direction of elastic waves between the first and second reflectors. The plurality of reflection members 17A may be arranged in a direction crossing, or not parallel or substantially parallel with the propagation direction of elastic waves or in multiple rows.

In the present modification, when viewed in plan view, the direction in which the long side of the reflection member 17A extends is preferably inclined approximately 45 degrees, for example, from the propagation direction of elastic waves. Thus, the excited elastic waves are more reliably reflected in a direction different from the propagation direction of elastic waves. Thus, the elastic wave device according to the present modification renders the reflected elastic waves less likely to return to the first or second elastic wave element 15 or 16 and more efficiently maintains its characteristics. From this view point, preferably, the direction in which the long side of the reflection member 17A extends is inclined about 45 degrees plus or minus about 25 degrees, for example, from the propagation direction of elastic waves.

Figure 5:
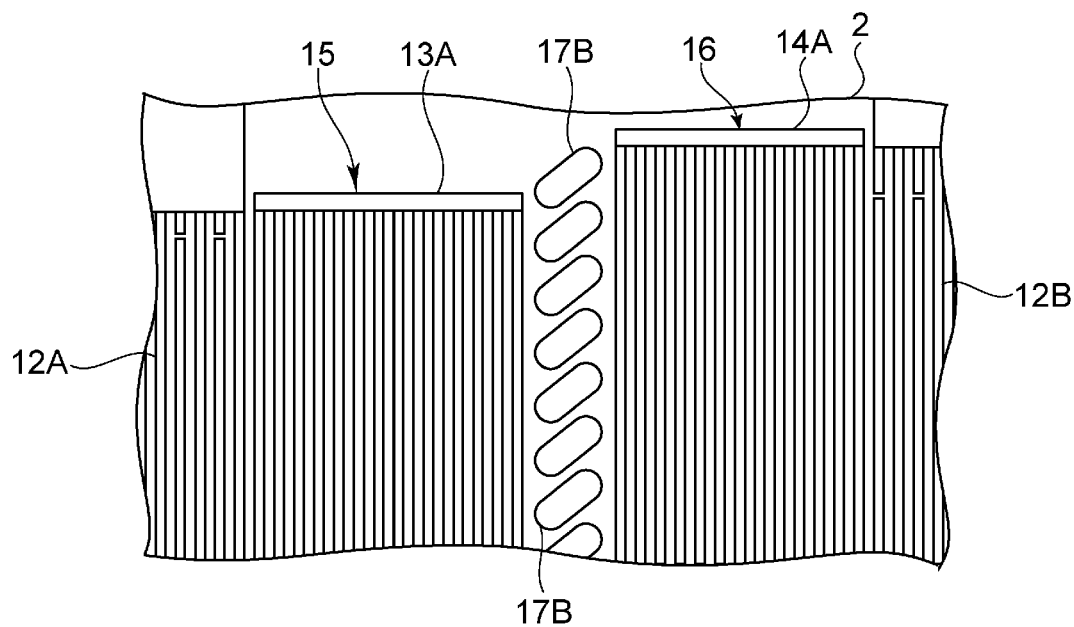
FIG. 5 is an enlarged schematic plan view of a portion of an elastic wave device according to a second modification of a preferred embodiment of the present invention, in which first and second elastic wave elements are disposed.

FIG. 5 is an enlarged schematic plan view of a portion of an elastic wave device according to a second modification of a preferred embodiment of the present invention, in which the first and second elastic wave elements are disposed.

As illustrated in FIG. 5, in the elastic wave device according to the second modification, reflection members 17B preferably have an oval or substantially oval shape, for example, when viewed in plan view. In the elastic wave device according to the second modification, a plurality of reflection members 17B are disposed in a single row in a direction perpendicular or substantially perpendicular to the propagation direction of elastic waves between the first and second reflectors 13A and 14A. When viewed in plan view, the direction in which the major axis of each reflection member 17B extends is preferably inclined approximately 45 degrees, for example, from the propagation direction of elastic waves. Other aspects are the same or substantially the same as those in the above-described elastic wave device 1.

In the elastic wave device according to the second modification, the plurality of reflection members 17B are able to reflect the elastic waves excited by the interdigital transducer electrodes 12A and 12B in at least a direction different from the propagation direction of elastic waves. Thus, the elastic wave device according to the second modification is able to have a small size and maintain its characteristics. In addition, the plurality of reflection members 17B are disposed in a single row in a direction perpendicular or substantially perpendicular to the propagation direction of elastic waves between the first and second reflectors 13A and 14A. Thus, the elastic wave device is able to have smaller size.

In the second modification, when viewed in plan view, the direction in which the major axis of the reflection member 17B extends is preferably inclined approximately 45 degrees, for example, from the propagation direction of elastic waves. Thus, the excited elastic waves are able to be more reliably reflected in a direction different from the propagation direction of elastic waves. In the elastic wave device according to the second modification, the reflected elastic waves are less likely to return to the first or second elastic wave element 15 or 16, so that the elastic wave device is able to more efficiently maintain its characteristics. From this point of view, preferably, the direction in which the major axis of the oval reflection member 17B extends is inclined about 45 degrees plus or minus 25 degrees, for example, from the propagation direction of elastic waves.

Similarly to the elastic wave device 1, the elastic wave device according to the second modification has a curved contour when viewed in plan view. Thus, the elastic wave device is able to scatter the propagating elastic waves in more directions.

Figure 6:
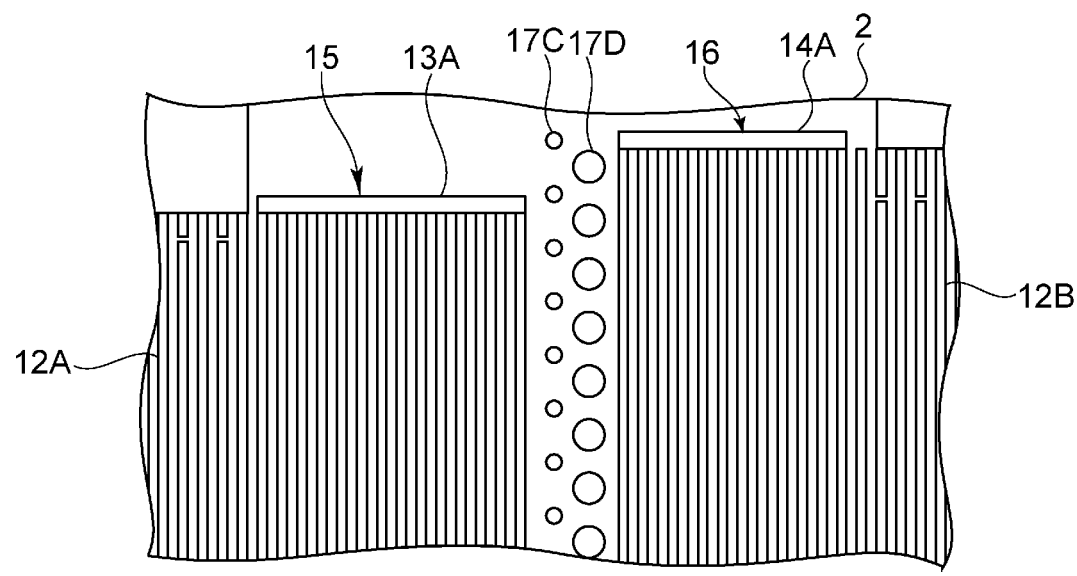
FIG. 6 is an enlarged schematic plan view of a portion of an elastic wave device according to a third modification of a preferred embodiment of the present invention, in which first and second elastic wave elements are disposed.

Although the elastic wave device 1 includes the reflection member 17 having the same or substantially the same size and shape, an elastic wave device may preferably include a combination of reflection members 17C and 17D having different sizes as in the case of a third modification illustrated in FIG. 6. Alternatively, although not illustrated, an elastic wave device may include a combination of reflection members having different shapes. Also in these cases, an elastic wave device is able to achieve the effects and advantages of preferred embodiments of the present invention, that is, a small size while efficiently maintaining its characteristics.

The above-described preferred embodiments have described with reference to examples in which resonators of a ladder filter are adjacent to each other. However, preferred embodiments of the present invention are widely applicable to elastic wave devices having various other structures in which a reflector of a first elastic wave element and a reflector of a second elastic wave element are adjacent to each other. For example, preferred embodiments of the present invention are also applicable to a structure in which the reflector of a longitudinally coupled resonator elastic wave filter is adjacent to a reflector of another resonator.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave device, comprising:
   a piezoelectric substrate;
   a first elastic wave element disposed on the piezoelectric substrate and including at least one first interdigital transducer electrode and a first reflector disposed over an area of the first interdigital transducer electrode at one side portion in a propagation direction of elastic waves; and
   a second elastic wave element disposed on the piezoelectric substrate and including at least one second interdigital transducer electrode and a second reflector disposed over an area of the second interdigital transducer electrode at one side portion in the propagation direction of elastic waves; wherein the first reflector and the second reflector are disposed side by side in the propagation direction of elastic waves;

the elastic wave device further includes a plurality of reflection members disposed in at least one row extending between the first reflector and the second reflector and in a direction perpendicular or substantially perpendicular to the propagation direction of elastic waves, the plurality of reflection members reflecting elastic waves in at least a direction different from the propagation direction of elastic waves; and in each of the at least one row, each of the plurality of the reflection members have a same or substantially a same shape and size and an entirety of each of the plurality of the reflection members is aligned with an entirety of each of others of the plurality of the reflection members in the direction perpendicular or substantially perpendicular to the propagation direction of elastic waves.

2. The elastic wave device according to claim 1, wherein the plurality of the reflection members are arranged with no gap therebetween in the propagation direction of elastic waves.

3. The elastic wave device according to claim 2, wherein the plurality of reflection members are disposed in a single row in the direction perpendicular or substantially perpendicular to the propagation direction of elastic waves.

4. The elastic wave device according to claim 2, wherein the plurality of reflection members are disposed in two rows each extending in the direction perpendicular or substantially perpendicular to the propagation direction of elastic waves.

5. The elastic wave device according to claim 2, wherein the plurality of reflection members include a combination of reflection members having different sizes.

6. The elastic wave device according to claim 1, wherein each of the plurality of reflection members has a curved contour when viewed in plan view.

7. The elastic wave device according to claim 6, wherein each of the plurality of reflection members has a circular or substantially circular shape when viewed in plan view.

8. The elastic wave device according to claim 6, wherein each of the plurality of reflection members has an oval or substantially oval shape when viewed in plan view.

9. The elastic wave device according to claim 1, wherein each of the plurality of reflection members has a rectangular or substantially rectangular shape when viewed in plan view.

10. The elastic wave device according to claim 8, wherein a direction in which a major axis of the oval or substantially oval reflection members is inclined 45 degrees plus or minus 25 degrees from the propagation direction of elastic waves when viewed in plan view.

11. The elastic wave device according to claim 9, wherein a direction in which a long side of the rectangular or substantially rectangular reflection members extends is inclined 45 degrees plus or minus 25 degrees from the propagation direction of elastic waves when viewed in plan view.

12. The elastic wave device according to claim 1, wherein the piezoelectric substrate is made of a piezoelectric single crystal.

13. The elastic wave device according to claim 1, wherein the at least one first interdigital transducer electrode and the at least one second interdigital transducer electrode are made of Al, Ti, Ag, Cu, Pt, or W or an alloy of Al, Ti, Ag, Cu, Pt or W.

14. The elastic wave device according to claim 1, wherein the first reflector and the second reflector are made of Al, Ti, Ag, Cu, Pt, or W or an alloy of Al, Ti, Ag, Cu, Pt or W.

15. The elastic wave device according to claim 1, wherein the plurality of reflection members are made of Al, Ti, Ag, Cu, Pt, or W or an alloy of Al, Ti, Ag, Cu, Pt or W.

16. An elastic wave device, comprising:

a piezoelectric substrate;

a first elastic wave element disposed on the piezoelectric substrate and including at least one first interdigital transducer electrode and a first reflector disposed over an area of the first interdigital transducer electrode at one side portion in a propagation direction of elastic waves; and a second elastic wave element disposed on the piezoelectric substrate and including at least one second interdigital transducer electrode and a second reflector disposed over an area of the second interdigital transducer electrode at one side portion in the propagation direction of elastic waves; wherein the first reflector and the second reflector are disposed side by side in the propagation direction of elastic waves;

the elastic wave device further includes a plurality of reflection members disposed in at least one row extending between the first reflector and the second reflector and in a direction perpendicular or substantially perpendicular to the propagation direction of elastic waves, the plurality of reflection members reflecting elastic waves in at least a direction different from the propagation direction of elastic waves; and in each of the at least one row, each of the plurality of the reflection members has a same or substantially a same shape and size and a center of each of the plurality of the reflection members is aligned with a center of each of others of the plurality of the reflection members in the direction perpendicular or substantially perpendicular to the propagation direction of elastic waves.

17. The elastic wave device according to claim 16, wherein the plurality of the reflection members are arranged with no gap therebetween in the propagation direction of elastic waves.

18. The elastic wave device according to claim 16, wherein each of the plurality of reflection members has a curved contour when viewed in plan view.

19. The elastic wave device according to claim 16, wherein each of the plurality of reflection members has a rectangular or substantially rectangular shape when viewed in plan view.

20. The elastic wave device according to claim 16, wherein a direction in which a long side of at least one of the plurality of reflection members extends is inclined 45 degrees plus or minus 25 degrees from the propagation direction of elastic waves when viewed in plan view.

* * * * *